US005420891A

United States Patent [19]
Akansu

[11] Patent Number: 5,420,891
[45] Date of Patent: May 30, 1995

[54] MULTIPLIERLESS 2-BAND PERFECT RECONSTRUCTION QUADRATURE MIRROR FILTER (PR-QMF) BANKS

[75] Inventor: Ali N. Akansu, Woodbridge, N.J.

[73] Assignee: New Jersey Institute of Technology, Newark, N.J.

[21] Appl. No.: 33,604

[22] Filed: Mar. 18, 1993

[51] Int. Cl.$^6$ ............................................. H04B 1/10
[52] U.S. Cl. ................................. 375/350; 375/240; 375/229; 348/398
[58] Field of Search ................... 375/99, 102, 103, 11, 375/12, 14, 15, 122; 358/426, 428; 348/384, 397, 398; 364/724.01, 724.2; 381/29, 30, 36; 382/56

[56] References Cited

U.S. PATENT DOCUMENTS

| | | | |
|---|---|---|---|
| 4,393,456 | 7/1983 | Marshall, Jr. ...................... | 364/724 |
| 4,569,075 | 2/1986 | Nussbaumer ....................... | 381/29 |
| 4,652,881 | 3/1987 | Lewis ................................. | 342/160 |
| 4,674,125 | 6/1987 | Carlson et al. ..................... | 382/49 |
| 4,785,348 | 11/1988 | Fonsalas et al. ................... | 358/133 |
| 4,799,179 | 1/1989 | Masson et al. ..................... | 364/724.1 |
| 4,815,023 | 3/1989 | Arbeiter ............................. | 364/724.01 |
| 4,829,378 | 5/1989 | Legall ................................ | 358/160 |
| 4,839,889 | 6/1989 | Geckler .............................. | 370/50 |
| 4,868,868 | 9/1989 | Yazu et al. ......................... | 381/37 |
| 4,918,524 | 4/1990 | Ansari et al. ...................... | 358/133 |
| 5,049,992 | 9/1991 | Citta et al. ......................... | 358/140 |
| 5,049,993 | 9/1991 | Legall et al. ....................... | 358/140 |
| 5,068,911 | 11/1991 | Resnikoff et al. .................. | 382/56 |
| 5,072,308 | 12/1991 | Lin et al. ........................... | 358/426 |
| 5,097,331 | 3/1992 | Chen et al. ........................ | 358/138 |
| 5,101,280 | 3/1992 | Moronaga et al. ................. | 358/426 |
| 5,128,791 | 7/1992 | Legall et al. ....................... | 358/141 |
| 5,148,498 | 9/1992 | Resnikoff et al. .................. | 382/54 |
| 5,182,645 | 1/1993 | Breeuwer et al. .................. | 358/141 |

OTHER PUBLICATIONS

R. E. Crochiere et al., "Digital Coding of Speech in Sub-bands," BSTJ, vol. 55, pp. 1069-1085.
D. Esteban et al., "Application of Quadrature Mirror Filters, etc." Proceedings of the IEEE International Conference on Acoustics, Speech & Signal Processing (ICASSP), 1977, pp. 191-195.
H. Gharavi et al., "Sub-band Coding of Digital Images Using Two-Dimensional Quadrature Mirror Filter," Proc. SPIE, vol. 707, Sep., 1986, pp. 51-61.
H. Gharavi et al., "Application of Quadrature Mirror Filtering to the Coding of Monochrome and Color Images," Proc. ICASSP, vol. 4, 1987, pp. 2384-2387.
M. Smith et al., "Exact Reconstruction Techniques for Tree Structured Subband Codes," IEEE Transactions on ASSP, vol. ASSP-34, Jun., 1986, pp. 434-441.
M. Vetterli, "Multi-dimensional Sub-band Coding: Some Theory & Algorithms," Signal Processing, 1984, pp. 97-112.
M. Vetterli, "Filter Bands Allowing Perfect Reconstruction," Signal Processing, vol. 10, No. 3, Apr. 1986, pp. 219-244.
P. H. Westerlink et al., "Sub-band Coding of Digital Images Using Predictive Vector Quantization," Proc. ICASSP, vol. 3, 1987, pp. 1378-1381.
J. W. Woods et al., "Sub-band Coding of Images," Proc. ICASSP, Apr., 1986, 1005-1008.
J. W. Woods et al., "Subband Coding of Images," IEEE Transactions on Acoustics, Speech & Signal Processing, vol. ASSP-34, Oct., 1986, pp. 1278-1288.

Primary Examiner—Stephen Chin
Assistant Examiner—Don Vo
Attorney, Agent, or Firm—Klauber & Jackson

[57] ABSTRACT

The Multiplierless Quadrature Mirror Filter concept is used in the design of analysis and synthesis filter banks to be used for the sub-band coding of various types of signals. The individual filters in the analysis and synthesis filter banks are designed to be near linear in phase, non-symmetrical in time, and to have equal bandwidth frequency responses. These multiplierless filters are relatively easy to implement in hardware and allow for the sub-band coding of signals with minimal computational complexity so as to result perfect signal reconstruction. Furthermore, these filters are particularly well suited for configuration in hierarchical sub-band structures.

22 Claims, 4 Drawing Sheets

MULTIPLIERLESS 2-BAND PERFECT RECONSTRUCTION QUADRATURE MIRROR FILTER (PR-QMF) BANKS

BACKGROUND OF THE INVENTION

1. Field of the Invention

The present invention relates to signal decomposition and reconstruction in sub-band coding and, more particularly, to analysis and synthesis filter banks that are designed according to the Quadrature Mirror Filter concept such that the sub-band coding of various types of signals may be accomplished with minimal computational complexity so as to result in perfect signal reconstruction.

2. Description of the Prior Art

Sub-band coding refers to a technique wherein, by the parallel application of a set of filters, an input signal is decomposed into a number of narrow band signals that are separately decimated and coded for the purpose of transmission. After transmission the signals are decoded, interpolated, and filtered so as to reconstruct the original signal. Originally, sub-band coding was developed for the transmission of speech signals (see e g. R. E. Crochiere et al., "Digital Coding of Speech in Sub-bands", BSTJ Vol. 55, pp. 1069–1085). More recently, however, sub-band coding has been used for the transmission of video signals (see e.g. J. W. Woods et al., "Subband Coding of Images" IEEE Transactions on Acoustics, Speech, and Signal Processing, Vol. ASSP-34, pp. 1278–1288, October 1986).

When designing a sub-band coding scheme, great emphasis is placed on the selection of analysis and synthesis filter banks. Such analysis and synthesis filter banks are used to decompose and reconstruct, respectively, the original signal. Much of the design work for these filter banks has been motivated by speech signal processing, wherein sharp band separation is a very desirable property. This work has led naturally to finite impulse response (FIR) filter banks with a large number of stages, e.g. 64. A classical approach to designing such filter banks is the Quadrature Mirror Filter approach, which allows substantially exact reconstruction of input speech signals (see e.g. D. Esteban et al., "Application of Quadrature Mirror Filters to Split Band Voice Coding Schemes", Proceedings of the IEEE International Conference on Acoustics, Speech, and Signal Processing (ICASSP), pp. 191–195, 1977). Application of the Quadrature Mirror Filter concept to the sub-band coding of video signals has recently received considerable attention since it has been shown that this approach is highly effective for image compression (see e.g. M. Vetterli, "Multi-dimensional Sub-band Coding: Some Theory and Algorithms", Signal Processing (1984), pp. 97–112; H. Gharavi et al., "Sub-band Coding of Digital Images Using Two-Dimensional Quadrature Mirror Filter" Proc SPIE, Vol 707, pp 51–61, September 1986; J. W. Woods et al., "Sub-Band Coding of Images" Proc ICASSP, pp 1005–1008, April 1986; H. Gharavi et al., "Application of Quadrature Mirror Filtering to the Coding of Monochrome and Color Images", Proc. ICASSP, Vol. 4, pp. 2384–2387, 1987; P. H. Westerink et al., "Sub-Band Coding of Digital Images Using Predictive Vector Quantization" Proc ICASSP, Vol 3, pp. 1378–1381, 1987). To date, however, substantially exact reconstruction of video signals using the Quadrature Mirror Filter concept has only been achieved through the use of long, multiple stage filter banks which are complex in hardware implementation and are computationally intensive.

A variety of other filter bank designs have been proposed which allow exact, or perfect, reconstruction of various types of sub-band coded signals (see e.g. M. Smith et al., "Exact Reconstruction Techniques for Tree Structured Subband Codes" IEEE Transactions on ASSP, Vol ASSP-34, pp 434–441, June 1986; M. Vetterli, "Filter Bands Allowing Perfect Reconstruction" Signal Processing, Vol. 10, No. 3, pp. 219–244, April 1986). However, these filter bank designs have not proven entirely satisfactory for the perfect reconstruction of sub-band coded video signals because of their high computational complexity. More recently, however, filter banks have been designed which allow for the perfect reconstruction sub-band coded video signals, wherein the individual filters in the analysis and synthesis filter banks are designed to be linear in phase, symmetrical in time, and to have unequal bandwidth frequency responses (see U.S. Pat. No. 4,829,378 by LeGall). Although these non-QMF filter banks are relatively easy to implement in hardware and allow for the perfect reconstruction of sub-band coded video signals with a relatively small amount of computational complexity, the unequal bandwidth frequency responses result in the original signal being disproportionately filtered, decimated, and coded during the decomposition stage, and disproportionately decoded, interpolated, and filtered during the reconstruction stage. As a consequence of the disproportionate filtering, such filter banks exhibit deteriorating frequency responses when used in hierarchical sub-band structures.

Although all of the above-mentioned filter bank designs allow for the sub-band coding of various types of signals, none employ the Quadrature Mirror Filter concept in the design of analysis and synthesis filter banks to the point where hardware implementation is easily obtained and sub-band coding of signals is accomplished with minimal computational complexity so as to result in perfect signal reconstruction. Such analysis and synthesis Quadrature Mirror Filter banks would be desirable since, as previously described, the Quadrature Mirror Filter approach has been shown to be highly effective for signal analysis, synthesis and generation. It would therefore be desirable to provide such analysis and synthesis Quadrature Mirror Filter banks so as to overcome the practical shortcomings of the prior art filter bank designs.

SUMMARY OF THE INVENTION

The present invention employs the Multiplierless Quadrature Mirror Filter concept in the design of analysis and synthesis filter banks to be used for the sub-band coding of various types of signals. The individual multiplierless filters in the analysis and synthesis filter banks are designed to be near linear in phase, non-symmetrical in time, and to have equal bandwidth frequency responses. These multiplierless filters are relatively easy to implement in hardware and allow for the sub-band coding of signals with minimal computational complexity so as to result in perfect signal reconstruction. Furthermore, these filters are particularly well suited for configuration in hierarchical sub-band structures. Multiplierless filters have the attribute of minimal computational complexity and relatively easy hardware implementation.

From the above descriptive summary, it is apparent how the Multiplierless Quadrature Mirror Filter concept may be employed in the design of analysis and synthesis filter banks in a manner that allows for relatively easy hardware implementation and that allows for the sub-band coding of various types of signals with minimal computational complexity so as to result in perfect signal reconstruction, thereby overcoming the shortcomings of the prior art filter bank designs.

Accordingly, the primary objective of the present invention is to design analysis and synthesis filter banks by employing the Multiplierless Quadrature Mirror Filter concept in a manner that allows for relatively easy hardware implementation and that allows for the sub-band coding of various types of signals with minimal computational complexity so as to result in perfect signal reconstruction.

Other objectives and advantages of the present invention will become apparent to those skilled in the art upon reading the following detailed description and claims, in conjunction with the accompanying drawings which are appended hereto.

BRIEF DESCRIPTION OF THE DRAWINGS

In order to facilitate a fuller understanding of the present invention, reference is now made to the appended drawings. These drawings should not be construed to limit the present invention, but are intended to be exemplary only.

DETAILED DESCRIPTION OF THE PRESENT INVENTION

Figure 1:
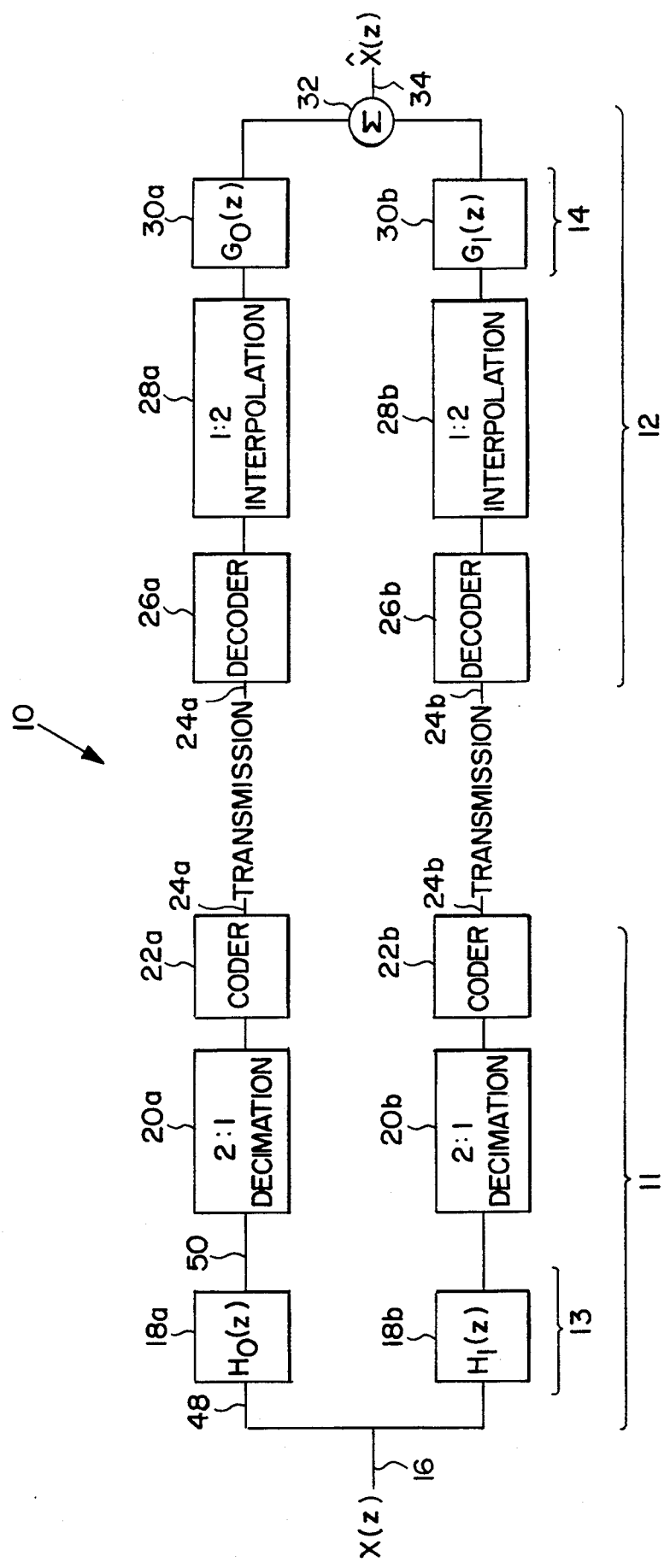
FIG. 1 is a schematic representation of a single-stage signal transmission system incorporating analysis and synthesis Quadrature Mirror Filter banks according to the present invention.
Figure 5:
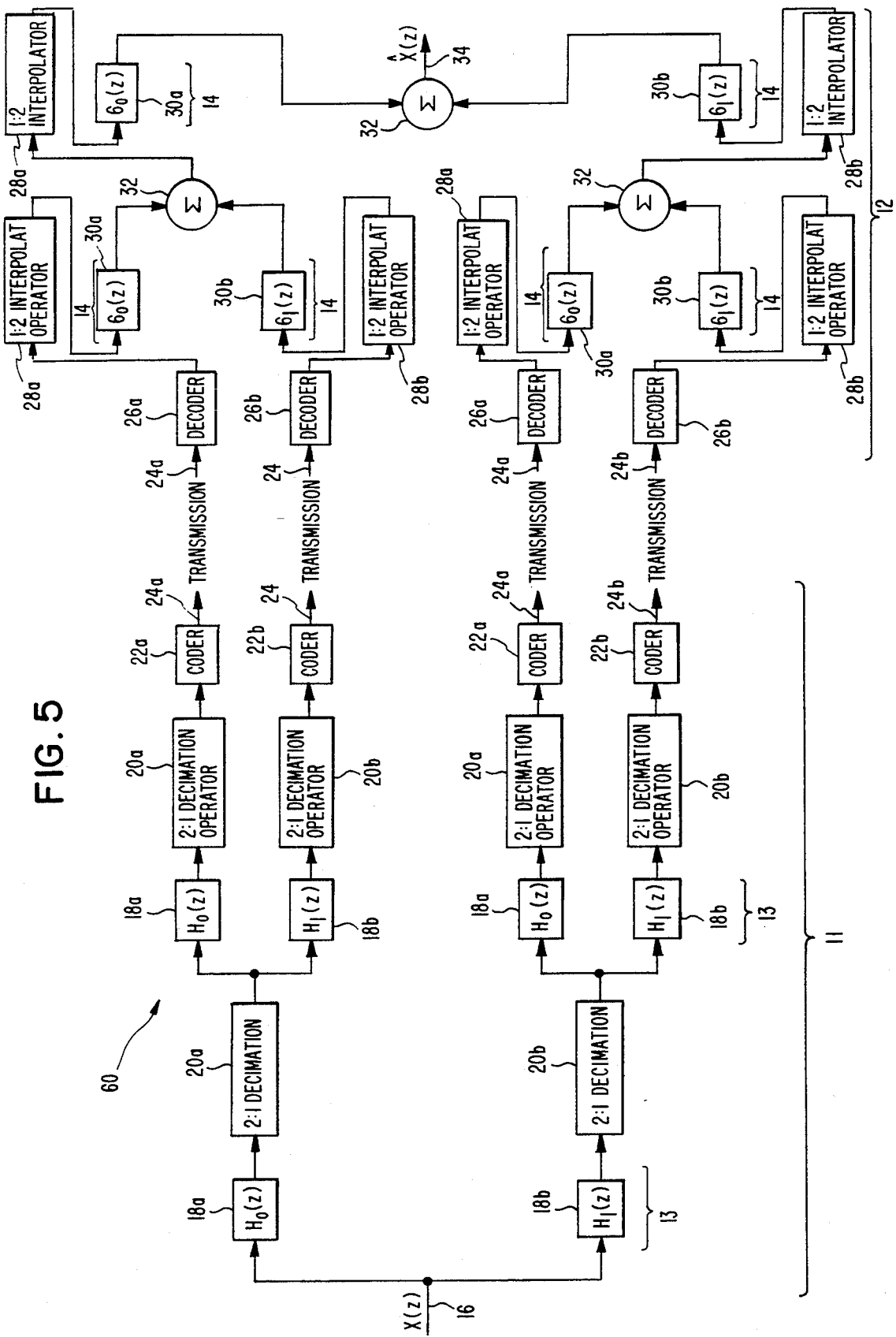
FIG. 5 is a schematic representation of a multiple-stage signal transmission system incorporating analysis and synthesis Quadrature Mirror Filter banks according to the present invention.

Referring to FIG. 1, there is shown a schematic representation of a single-stage signal transmission system 10 for the processing of one-dimensional signals. Included within this one-dimensional signal transmission system 10 are a transmitter section 11 and a receiver section 12 having analysis 13 and synthesis 14 Multiplierless Quadrature Mirror Filter banks respectively, according to the present invention. It should be noted that although only a single-stage signal transmission system 10 is described in detail herein, a multiple-stage signal transmission system for the processing of both one-dimensional and multi-dimensional signals may also be realized by utilizing the present invention Quadrature Mirror Filter banks in a hierarchical sub-band structure. Such a multiple-stage signal transmission system 60 is shown in FIG. 5.

In the single-stage system 10 of FIG. 1, an original discrete time signal, X(z), is input on line 16. This original signal, X(z), is filtered by analysis filters 18a and 18b, which have transfer functions $H_0(z)$ and $H_1(z)$, respectively. According to the present invention, the analysis filters 18a and 18b are designed to have equal bandwidth frequency responses. Thus, the original signal, X(z), is divided into two equal bandwidth sub-band signals; e.g. a low frequency sub-band signal and a high frequency sub-band signal.

After the original signal, X(z), is filtered, the two resulting signals are decimated by decimation operators 20a and 20b. In the decimation operators 20a and 20b of FIG. 1, the decimation operation is 2:1, meaning that one out of every two sample values in the filtered discrete time signals are removed. This decimation operation allows the transmission rate of the system 10 to remain constant. The resulting filtered and decimated signals are then coded by means of coders 22a and 22b for transmission via lines 24a and 24b, respectively, to the receiver section 12. At this point it should be noted that the filtered and decimated signals may be divided into further sub-bands prior to their being coded. Such further sub-band division is accomplished by further filtering and decimating the signals filtered and decimated. The multiple-stage signal transmission system 60 shown in FIG. 5 would accomplish such further sub-band division thereby allowing multi-resolution. It should be further noted, however, that with every decimation operation a decrease in signal resolution results.

The filtered and decimated signals are individually coded by the coders 22a and 22b. These signals may be coded using any number of conventional coding techniques including, for example, the DCPM technique described in H. Gharavi et al., "Sub-band Coding of Digital Images Using Two Dimensional Quadrature Mirror Filtering" Proc. SPIE Visual Communication and Image Processing, pp. 51–61, September 1986. Since the two signals are equally divided along the frequency spectrum, only one common coding technique need be utilized. Thus, the use of the Multiplierless Quadrature Mirror Filter concept encourages functional duplication within the signal transmission system 10. After the two filtered and decimated signals are coded, they are individually transmitted to the receiver section 12 via lines 24a and 24b.

When the two transmitted signals arrive at the receiver section 12, they are decoded by means of decoders 26a and 26b. The two decoded signals are then interpolated by interpolation operators 28a and 28b. In the interpolation operators 28a and 28b of FIG. 1, the interpolation operation is 1:2, meaning that a sample having a zero value is added between every sample in the decoded discrete time signals. This interpolation operation increases the total number of samples in the decoded discrete time signals by a factor of two, thereby restoring the total number of samples to that of the original signal, X(z).

The two resulting decoded and interpolated signals are filtered by synthesis filters 30a and 30b, which have transfer functions $G_0(z)$ and $G_1(z)$, respectively. Similar to the analysis filters 18a and 18b, the synthesis filters 30a and 30b are designed to have equal bandwidth frequency responses. Thus, the two resulting filtered signals encompass two equal bandwidth sub-bands; e.g. a low frequency sub-band and a high frequency sub-band, respectively. These two sub-band signals are then summed by an adder circuit 32 so as to produce a discrete time signal, $\hat{X}(z)$, on line 34 that is a perfect reconstruction of the original signal, X(z), if no quantization or transmission errors occur.

As indicated above, the analysis 13 and synthesis 14 Multiplierless Quadrature Mirror Filter banks are relatively easy to implement in hardware and allow for the sub-band coding of signals with minimal computational complexity so as to result in perfect signal reconstruction. To understand how such multiplierless filter banks 13 and 14 are implemented within the PR-QMF concept, the original signal, X(z), may be traced through the transmitter section 11 and the receiver section 12 of the single-stage system 10 of FIG. 1, so as to arrive at the following expression, $$\hat{X}(z) = T(z)X(z) + S(z)X(-z) \quad (1)$$

where, $$T(z) = [H_0(z)G_0(z) + H_1(z)G_1(z)]/2 \quad (2)$$

$$S(z) = [H_0(-z)G_0(z) + H_1(-z)G_1(z)]/2. \quad (3)$$

Perfect reconstruction requires that, i.) $S(z) = 0$; for all $z$ \quad (4)

and, ii.) $T(z) = cz^{-K}$; for all $z$ \quad (5)

where c is a constant and K is an integer.
The choice of, $$G_0(z) = -H_1(-z) \quad (6)$$

and, $$G_1(z) = H_0(-z) \quad (7)$$

satisfies the first requirement that $S(z) = 0$ and eliminates any aliasing. Next, with N odd, one can choose, $$H_1(z) = z^{-N}H_0(-z^{-1}) \quad (8)$$

leaving, $$T(z) = z^{-N}[H_0(z)H_0(z^{-1}) + H_0(-z)H_0(-z^{-1})]/2. \quad (9)$$

With these constraints, the perfect reconstruction requirement reduces to finding an $H(z) = H_0(z)$ such that, $$H(z)H(z)^{-1} + H(-z)H(z)^{-1} = \text{constant}. \quad (10)$$

This selection implies that all four filters 18a, 18b, 30a, and 30b are causal whenever $H_0(z)$ is causal. The above-stated perfect reconstruction requirement can readily be recast in an alternate time domain form as described in A. Akansu et al., "The Binomial QMF-Wavelet Transform for Multiresolution Signal Decomposition", IEEE Transactions on Signal Processing, Vol. 41, No. 1, January 1993, to yield the perfect reconstruction requirement, $$\sum_{n=0}^{N} h(n)h(n + 2k) = Q\delta(k) \quad (11)$$

where Q is an integer normalization factor and, $$\delta(k) = 1 \text{ for } k = 0 \quad (12)$$

$$\delta(k) = 0 \text{ for all other } k. \quad (13)$$

According to the present invention, the individual filters 18a, 18b, 30a, and 30b in the analysis 13 and synthesis 14 filter banks are designed to be near linear in phase, non-symmetrical in time, and to have equal bandwidth frequency responses. In further accord with the present invention, the multiplierless filters are relatively easy to implement in hardware and allow for the sub-band coding of signals with minimal computational complexity. Such filters are obtained by imposing the following binary shift or binary shift and add operational constraints on the prototype low pass analysis filter coefficients given in equation 11, $$h(n) = \sum_{i=1}^{P} \pm 2^{\pm k_n^{(i)}} \quad (14)$$

where, $$n = 0, 1, \ldots, N \quad (15)$$

where N+1 is the duration of the filter, where, $$k_n^{(i)} = \text{integers} \quad (16)$$

and where there is no limit on the value of P in equation 14, although the lower the value of P the higher the efficiency of the filter. Equation 14 defines the multiplierless filter to be embedded in the PR-QMF concept in order to achieve minimal computational complexity and ease of hardware implementation.

Referring to Table 1, the filter coefficients of, for example, 4, 6, 8, and 10-tap, low-pass analysis Multiplierless Perfect Reconstruction Quadrature Mirror Filters (M-PR-QMF's) are listed which were derived in accordance with the above-stated perfect reconstruction requirement and filter coefficient constraints. It should be noted that corresponding filter coefficients for the high-pass analysis filter and the low-pass and high-pass synthesis filters can be derived directly from these low-pass analysis filter coefficients. Note that the filter coefficients in Table 1, and those derived from the filter coefficients in Table 1, are non-symmetrical, thereby effecting a non-linear, although linear-like, phase response, as will be described shortly. Also note that these filter coefficients were derived with P=1, or P=2.

TABLE 1

| n | h(n) 10-tap | 8-tap | 6-tap | 4-tap |
|---|---|---|---|---|
| 0 | −1 | −8 | 4 | 2 |
| 1 | −3 | 8 | 16 | 6 |
| 2 | 9 | 64 | 16 | 3 |
| 3 | 33 | 64 | 0 | 1 |
| 4 | 32 | 8 | −4 | |
| 5 | 4 | −8 | 1 | |
| 6 | −9 | 1 | | |
| 7 | 1 | 1 | | |
| 8 | 3 | | | |
| 9 | −1 | | | |

For the 8-tap case, for example, the filter transfer function is expressed as follows, $$H_0(z) = -8 + 8z^{-1} + 64z^{-2} + 64z^{-3} + 8z^{-4} - 8z^{-5} + z^{-6} + z^{-7}. \quad (17)$$

Figure 2:
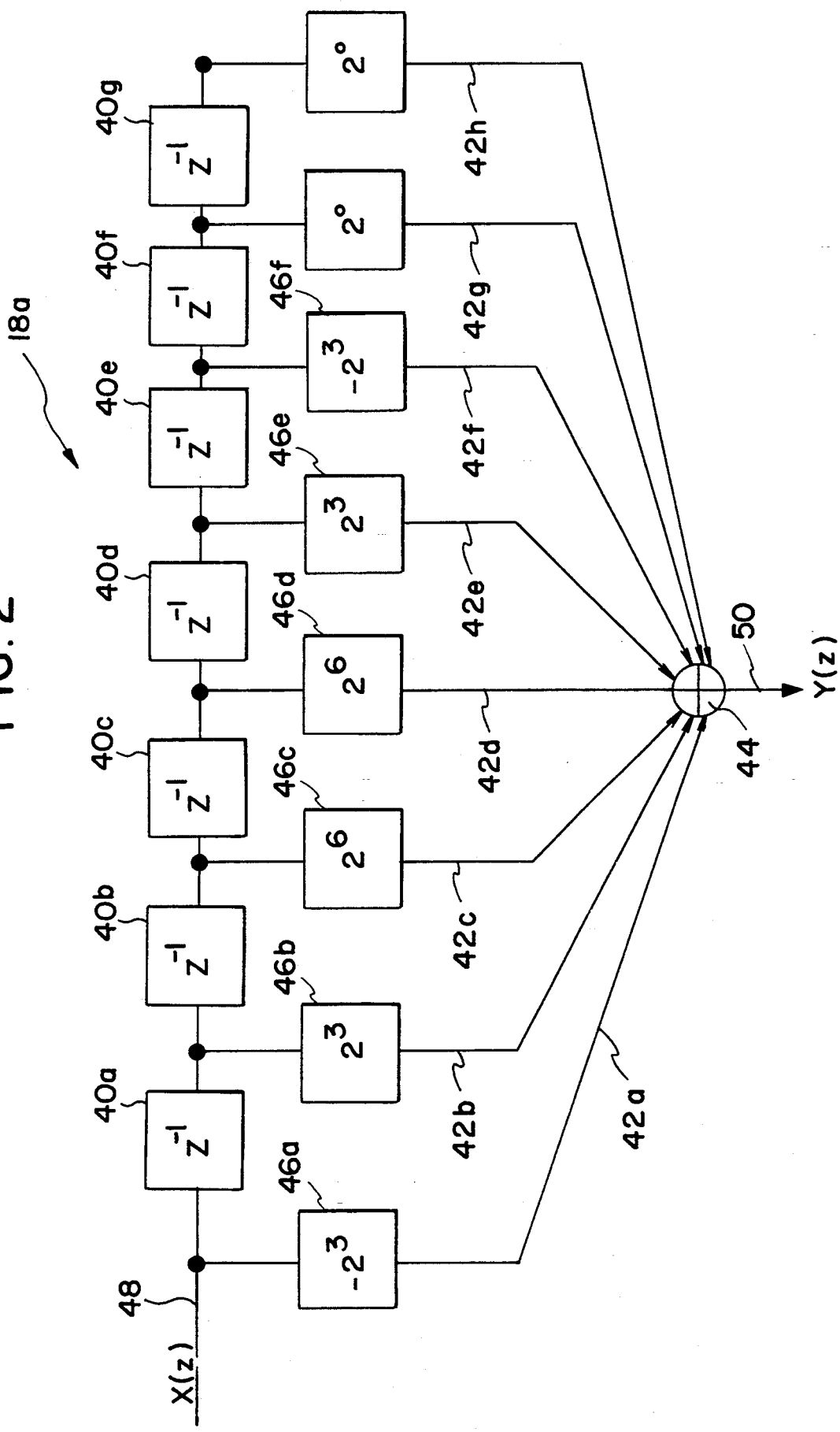
FIG. 2 is a schematic representation of an 8-tap, low pass Perfect Reconstruction Quadrature Mirror Filter according to the present invention.

Referring to FIG. 2, a schematic representation of the analysis filter 18a having the transfer function expressed in equation 17 above is shown. The filter 18a is comprised of seven stages 40a, 40b, 40c, 40d, 40e, 40f, and 40g, each of which represents a unit time delay, and eight taps 42a, 42b, 42c, 42d, 42e, 42f, 42g, and 42h, each of which maintains a series connected coefficient multiplier 46a, 46b, 46c, 46d, 46e, 46f, 46g, and 46h, and ties into an adder circuit 44. It should be noted that, in accordance with the multiplierless aspect of the present invention, the series connected coefficient multipliers 46a, 46b, 46c, 46d, 46e, 46f, 46g, and 46h do not function as conventional multipliers but as shift operators. An original discrete time signal, X(z), is input to the filter 18a on line 48, where it then propagates through the filter 18a from one stage to the next. This original discrete time signal, X(z), is comprised of a series of digital samples. A filtered discrete time signal, Y(z), is output on line 50. This filtered discrete time signal, Y(z), is formed by adding the present original signal sample, which is multiplied via a shift operation, by its respective coefficient 46a, to the seven previous original signal samples, after each has been multiplied via a shift operation, by their respective coefficients 46b, 46c, 46d, 46e, 46f, 46g, and 46h. Thus, the filtered signal, Y(z), is a linear combination of the present original signal sample and the seven previous original signal samples. Such a filter is classified as a finite impulse response filter.

The filter coefficients 46a, 46b, 46c, 46d, 46e, 46f, 46g, and 46h, are obtained directly from the filter transfer function, H₀(z), expressed in equation 17 above. In this transfer function, the $z^{-1}$ term represents a one unit time delay, the $z^{-2}$ term represents a two unit time delay, the $z^{-3}$ term represents a three unit time delay, and so on until the $z^{-7}$ term represents a seven unit time delay. Thus, the filter coefficient 46a of the present original signal sample is $-2^3$ or $-8$, the filter coefficient 46b of the previous original signal sample is $2^3$ or 8, the filter coefficient 46c of the second previous original signal sample is $2^6$ or 64, and so on until the filter coefficient 46h of the seventh previous original signal sample is $2^0$ or 1.

As previously stated, and as can be observed from Table 1, the present invention M-PR-QMF's have filter coefficients that are non-symmetrical in time. Also as previously stated, these filters are easy to implement in hardware and allow for the sub-band coding of signals with minimal computational complexity. Such is the case since all of the filter coefficients are decomposable into power of two integers. This means that filter computations can be carried out using only binary shift or binary shift and add operations, thereby requiring only relatively simple circuitry to carry out these relatively simple filter computations. It should be noted that the 8-tap, low-pass analysis M-PR-QMF 18a having the transfer function expressed in equation 17 above requires only binary shift operations.

Figure 3:
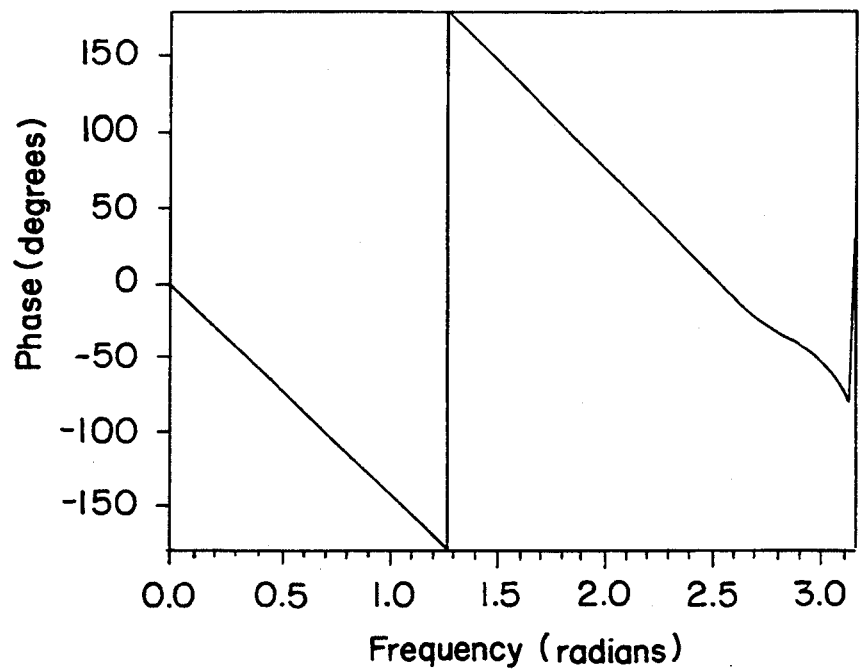
FIG. 3 shows the phase response of the 8-tap, low pass Perfect Reconstruction Quadrature Mirror Filter shown in FIG. 2.
Figure 4:
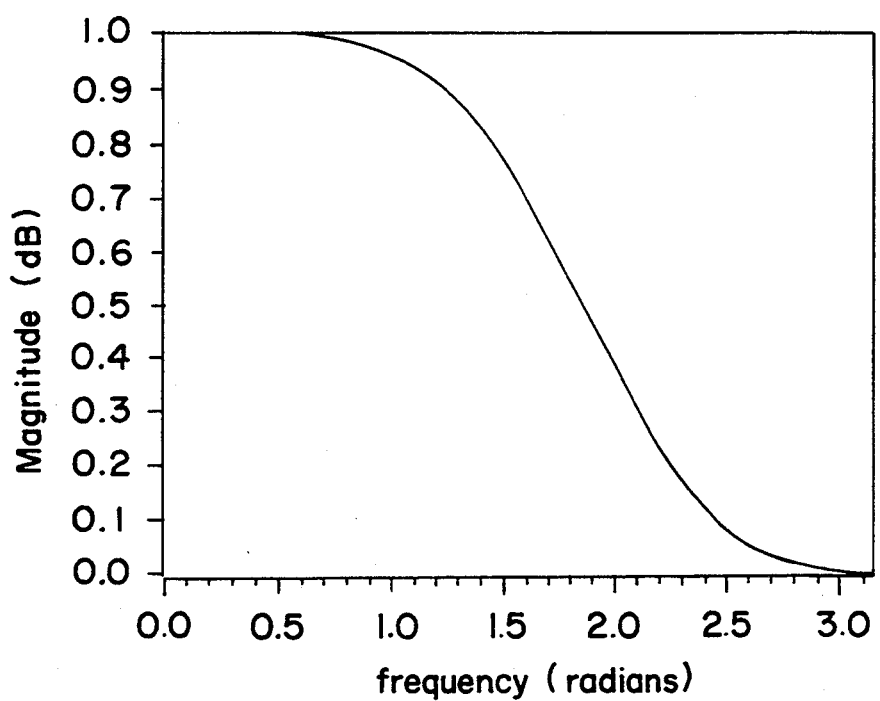
FIG. 4 shows the magnitude response of the 8-tap, low pass Perfect Reconstruction Quadrature Mirror Filter shown in FIG. 2.

Finally, it was also previously stated that the present invention M-PR-QMF's are near linear in phase and have equal bandwidth frequency responses. Referring to FIGS. 3 and 4, there are shown the phase and magnitude responses, respectively, of the 8-tap, low-pass analysis filter 18a having the transfer function expressed in equation 17 above. Although many of the prior art filter designs emphasize the importance of a linear phase response (see U.S. Pat. No. 4,829,378 by LeGall), it has been found that PR-QMF designs favor an equal bandwidth property since it is theoretically impossible to achieve strict phase linearity using the PR-QMF approach. However, as can be seen in FIG. 3, the phase response of filter 18a is only marginally non-linear. Thus, a linear-like phase response can still be achieved using the M-PR-QMF approach.

With the present invention now fully described it can thus be seen that the primary objective set forth above is efficiently attained and, since certain changes may be made in the above described M-PR-QMF design approach without departing from the scope of the invention, it is intended that all matter contained in the above description or shown in the accompanying drawings shall be interpreted as illustrative and not in a limiting sense.

What is claimed is:

1. A multiplierless filter bank to be used in the sub-band coding of various types of signals, said multiplierless filter bank comprising at least one pair of finite impulse response filters connected in parallel, said finite impulse response filters in each said pair of finite impulse response filters having non-symmetrical filter coefficients which are decomposable into power of two integers such that filter computations are carried out using only binary shift or binary shift and add operations, said finite impulse response filters in each said pair of finite impulse response filters being Multiplierless Quadrature Mirror Filters which satisfy the perfect reconstruction requirement, $$\sum_{n=0}^{N} h(n)h(n+2k) = Q\delta(k)$$

wherein Q is an integer normalization factor, wherein $\delta(k)=1$ for K=0

$\delta(k)=0$ for all other k wherein N+1 is the order of said Multiplierless Quadrature Mirror Filters, wherein $$h(n) = \sum_{i=1}^{P} \pm 2^{\pm k_n^{(i)}}$$

wherein n=0, 1,...,N wherein $k_n^{(i)}$=integers and wherein there is no limit on the value of P, although the lower the value of P the higher the efficiency of said Multiplierless Quadrature Mirror Filters.

2. The multiplierless filter bank as defined in claim 1, wherein said finite impulse response filters in each said pair of finite impulse response filters have equal bandwidth frequency responses such that two equal bandwidth sub-band signals are formed from each of said various types of signals that is applied to each said pair of finite impulse response filters.

3. The multiplierless filter bank as defined in claim 1, wherein said finite impulse response filters in each said pair of finite impulse response filters have linear-like phase responses.

4. The multiplierless filter bank as defined in claim 1, wherein a plurality of said finite impulse response filter pairs are configured in a hierarchical sub-band structure so as to form a plurality of equal bandwidth sub-band signal pairs.

5. The multiplierless filter bank as defined in claim 1, wherein said various types of signals include one-dimensional and multi-dimensional signals.

6. A sub-band coding system for various types of signals, said sub-band coding system comprising:

a first multiplierless filter bank for analyzing each of said various types of signals into a plurality of sub-band signals, wherein said first multiplierless filter bank comprises at least one pair of finite impulse response filters having non-symmetrical filter coefficients which are decomposable into power of two integers such that filter computations are carried out using only binary shift or binary shift and add operations, wherein said finite impulse response filters in each said pair of finite impulse response filters in said first multiplierless filter bank are Multiplierless Quadrature Mirror Filters which satisfy the perfect reconstruction requirement, $$\sum_{n=0}^{N} h(n)h(n + 2k) = Q\delta(k)$$

wherein Q is an integer normalization factor, wherein $\delta(k)=1$ for $k=0$ $\delta(k)=0$ for all other k wherein $N+1$ is the order of said Multiplierless Quadrature Mirror Filters, wherein $$h(n) = \sum_{i=1}^{P} \pm 2^{\pm k_n^{(i)}}$$

wherein $n=0, 1, \ldots, N$ wherein $k_n^{(i)}=$ integers and wherein there is no limit on the value of P, although the lower the value of P the higher the efficiency of said Multiplierless Quadrature Mirror Filters; and a second multiplierless filter bank, connected in, series with said first multiplierless filter bank, for synthesizing each of said various types of analyzed signals from said plurality of sub-band signals, wherein said second multiplierless filter bank comprises at least one pair of finite impulse response filters having non-symmetrical filter coefficients which are decomposable into power of two integers such that filter computations are carried out using only binary shift or binary shift and add operations, wherein said finite impulse response filters in each said pair of finite impulse response filters in said second multiplierless filter bank are Multiplierless Quadrature Mirror Filters which satisfy the perfect reconstruction requirement, $$\sum_{n=0}^{N} h(n)h(n + 2k) = Q\delta(k)$$

wherein Q is an integer normalization factor, wherein $\delta(k)=1$ for $k=0$ $\delta(k)=0$ for all other k wherein $N+1$ is the order of said Multiplierless Quadrature Mirror Filters, wherein $$h(n) = \sum_{i=1}^{P} \pm 2^{\pm k_n^{(i)}}$$

wherein $n=0, 1, \ldots, N$ wherein $k_n^{(i)}=$ integers and wherein there is no limit on the value of P, although the lower the value of P the higher the efficiency of said Multiplierless Quadrature Mirror Filters.

7. The sub-band coding system as defined in claim 6, wherein said plurality of sub-band signals are decimated by a decimation operator and then coded by a coder after being analyzed by said first multiplierless filter bank.

8. The sub-band coding system as defined in claim 7, wherein said plurality of decimated and coded sub-band signals are decoded by a decoder and then interpolated by an interpolation operator before being synthesized by said second multiplierless filter bank.

9. The sub-band coding system as defined in claim 6, wherein said first multiplierless filter bank comprises at least one pair of multiplierless finite impulse response filters having transfer functions $H_0(z)$ and $H_1(z)$, and wherein said second multiplierless filter bank comprises at least one corresponding pair of multiplierless finite impulse response filters having transfer functions $G_0(z)=-H_1(-z)$ and $G_1(z)=H_0(-z)$, such that said second multiplierless filter bank serves to synthesize a perfect reconstruction of each of said various types of analyzed signals from said plurality of sub-band signals.

10. The sub-band coding system as defined in claim 9, wherein said multiplierless finite impulse response filters in each said pair of multiplierless finite impulse response filters have equal bandwidth frequency responses such that two equal bandwidth sub-band signals are formed from each signal that is applied to each said pair of multiplierless finite impulse response filters.

11. The sub-band coding system as defined in claim 10, wherein said multiplierless finite impulse response filters in each said pair of multiplierless finite impulse response filters have linear-like phase responses.

12. The sub-band coding system as defined in claim 9, wherein a plurality of multiplierless finite impulse response filter pairs are configured in a hierarchical sub-band structure so as to form a plurality of equal bandwidth sub-band signal pairs.

13. The sub-band coding system as defined in claim 9, wherein said various types of signals include one-dimensional and multi-dimensional signals.

14. A sub-band coding system for various types of signals, said sub-band coding system comprising:

at least one pair of finite impulse response Multiplierless Quadrature Mirror Filters (M-QMF's) for analyzing each of said various types of signals into a plurality of analyzed sub-band signals, wherein said finite impulse response M-QMF's in each said pair of analyzing M-QMF's have non-symmetrical filter coefficients which are decomposable into power of two integers such that filter computations are carried out using only binary shift or binary shift and add operations, wherein said finite impulse response M-QMF's in each said pair of analyzing M-QMF's satisfy the perfect reconstruction requirement, $$\sum_{n=0}^{N} h(n)h(n+2k) = Q\delta(k)$$

wherein Q is an integer normalization factor, wherein $\delta(k) = 1$ for $k = 0$ $\delta(k) = 0$ for all other k wherein N+1 is the order of said M-QMF's, wherein $$h(n) = \sum_{i=1}^{P} \pm 2^{\pm k_n^{(i)}}$$

wherein $n = 1, 1, \ldots, N$ wherein $k_n^{(i)} =$ integers and wherein there is no limit on the value of P, although the lower the value of P the higher the efficiency of said M-QMF's;

means for decimating each of said analyzed sub-band signals;

means for coding each of said decimated sub-band signals;

means for decoding each of said coded sub-band signals;

means for interpolating each of said decoded sub-band signals;

at least one pair of finite impulse response Multiplierless Quadrature Mirror Filters (M-QMF's) for synthesizing each of said analyzed sub-band signals from said plurality of interpolated sub-band signals, wherein said finite impulse response M-QMF's in each said pair of synthesizing M-QMF's have non-symmetrical filter coefficients which are decomposable into power of two integers such that filter computations are carried out using only binary shift or binary shift and add operations, wherein said finite impulse response M-QMF's in each said pair of synthesizing M-QMF's satisfy the perfect reconstruction requirement, wherein Q is an integer normalization factor, wherein $$\sum_{n=0}^{N} h(n)h(n+2k) = Q\delta(k)$$

$\delta(k) = 1$ for $k = 0$ $\delta(k) = 0$ for all other k wherein N+1 is the order of said M-QMF's, wherein $$h(n) = \sum_{i=1}^{P} \pm 2^{\pm k_n^{(i)}}$$

wherein $n = 0, 1, \ldots, N$ wherein $k_n^{(i)} =$ integers and wherein there is no limit on the value of P, although the lower the value of P the higher the efficiency of said M-QMF's; and means for summing said synthesized analyzed sub-band signals so as to perfectly reconstruct each of said various types of analyzed signals.

15. The sub-band coding system as defined in claim 14, wherein said finite impulse response M-QMF's in each said pair of analyzing M-QMF's have transfer functions $H_0(z)$ and $H_1(z)$, and wherein said finite impulse response M-QMF's in each said pair of synthesizing M-QMF's have transfer functions $G_0(z) = -H_1(-z)$ and $G_1(z) = H_0(-z)$ corresponding with the transfer functions of said finite impulse response M-QMF's in each said pair of analyzing M-QMF's.

16. The sub-band coding system as defined in claim 14, wherein said finite impulse response M-QMF's in each said pair of analyzing M-QMF's have equal bandwidth frequency responses such that two equal bandwidth sub-band signals are formed from each of said various types of signals that is applied to each said pair of analyzing M-QMF's, and wherein said finite impulse response M-QMF's in each said pair of synthesizing M-QMF's have equal bandwidth frequency responses corresponding with the frequency responses of said finite impulse response M-QMF's in each said pair of analyzing M-QMF's.

17. The sub-band coding system as defined in claim 14, wherein said finite impulse response M-QMF's in each said pair of analyzing M-QMF's have linear-like phase responses, and wherein said finite impulse response M-QMF's in each said pair of synthesizing M-QMF's have linear-like phase responses.

18. A multiplierless filter bank, said multiplierless filter bank comprising at least one pair of finite impulse response filters connected in parallel, said finite impulse response filters in each said pair of finite impulse response filters having non-symmetrical filter coefficients which are decomposable into power of two integers such that filter computations are carried out using only binary shift or binary shift and add operations, said finite impulse response filters in each said pair of finite impulse response filters being Multiplierless Quadrature Mirror Filters which satisfy the perfect reconstruction requirement, $$\sum_{n=0}^{N} h(n)h(n+2k) = Q\delta(k)$$

wherein Q is an integer normalization factor, wherein $\delta(k)=1$ for $k=0$ $\delta(k)=0$ for all other k wherein N+1 is the order of said Multiplierless Quadrature Mirror Filters, wherein $$h(n) = \sum_{i=1}^{P} \pm 2^{\pm k_n^{(i)}}$$

wherein $n=0, 1, \ldots, N$ wherein $k_n^{(i)}=$integers and wherein there is no limit on the value of P, although the lower the value of P the higher the efficiency of said Multiplierless Quadrature Mirror Filters.

19. The multiplierless filter bank as defined in claim 18, wherein said finite impulse response filters in each said pair of finite impulse response filters have equal bandwidth frequency responses such that two equal bandwidth sub-band signals are formed from each signal that is applied to each said pair of finite impulse response filters.

20. The multiplierless filter bank as defined in claim 18, wherein said finite impulse response filters in each said pair of finite impulse response filters have linear-like phase responses.

21. The multiplierless filter bank as defined in claim 18, wherein a plurality of said finite impulse response filter pairs are configured in a hierarchical sub-band structure so as to form a plurality of equal bandwidth sub-band signal pairs.

22. The multiplierless filter bank as defined in claim 18, wherein one-dimensional and multi-dimensional signals are applied to each said pair of finite impulse response filters.

* * * * *